United States Patent [19]
Tani

[11] Patent Number: 5,578,510
[45] Date of Patent: Nov. 26, 1996

[54] METHOD OF MAKING AN ISOLATION LAYER STACK SEMICONDUCTOR DEVICE

[75] Inventor: Tomofune Tani, Tokyo, Japan

[73] Assignee: Nippon Steel Corporation, Tokyo, Japan

[21] Appl. No.: 547,157

[22] Filed: Oct. 24, 1995

Related U.S. Application Data

[63] Continuation of Ser. No. 219,296, Mar. 28, 1994, abandoned.

[30] Foreign Application Priority Data

Mar. 30, 1993 [JP] Japan ................................ 5-096924

[51] Int. Cl.$^6$ ............................................. H01L 21/265
[52] U.S. Cl. ................... 437/35; 437/61; 437/28; 437/26
[58] Field of Search ............................ 437/35, 29, 153, 437/154, 28, 61, 26

[56] References Cited

U.S. PATENT DOCUMENTS

| | | |
|---|---|---|
| 4,570,331 | 2/1986 | Eaton, Jr. et al. . |
| 4,818,235 | 4/1989 | Chao ............................................ 437/61 |
| 4,830,977 | 5/1989 | Katto et al. ................................. 437/28 |
| 4,849,366 | 7/1989 | Hsu et al. .................................... 437/42 |
| 4,937,756 | 6/1990 | Hsu et al. .................................. 364/490 |
| 4,943,536 | 7/1990 | Havemann .................................. 437/28 |
| 5,147,811 | 9/1992 | Sakagami ................................... 437/35 |
| 5,183,768 | 2/1993 | Kameyama et al. ....................... 437/35 |
| 5,260,229 | 11/1993 | Hodges et al. ............................ 437/61 |
| 5,270,227 | 12/1993 | Kameyama et al. ....................... 437/35 |
| 5,344,787 | 9/1994 | Nagalingam et al. ..................... 437/35 |
| 5,350,700 | 9/1994 | Yang et al. ................................ 437/35 |

OTHER PUBLICATIONS

Fully Planarized 0.5um Technologies For 16M DRAM, W. Wakaniya et al., IEDM Tech. Dig. pp. 246–249 1988.
A 0.5um Isolation Technology Using advanced Poly Silicon IEDM pp. 100–103 1988.

*Primary Examiner*—Tom Thomas
*Assistant Examiner*—Lynne A. Gurley
*Attorney, Agent, or Firm*—Law Offices Pollock, Vande Sande & Priddy

[57] ABSTRACT

A method of making a semiconductor device includes forming of an element isolation layer stack on a first region of a silicon substrate between adjacent element forming regions and injecting impurity ions upon a surface of the silicon substrate so as to form a diffusion layer. The diffusion layer is formed to include a first portion disposed in a surface of the substrate just beneath the element isolation layer stack and at the same time a second portion disposed in the substrate inside each of the element forming regions at a depth which is at a distance from the surface of the substrate and deeper than the first portion.

6 Claims, 4 Drawing Sheets

METHOD OF MAKING AN ISOLATION LAYER STACK SEMICONDUCTOR DEVICE

This application is a Continuation of U.S. patent application Ser. No. 08/219,296, filed Mar. 28, 1994 now abandoned.

BACKGROUND OF THE INVENTION

1. Field of the Invention

The present invention relates to a semiconductor device and a method of making the device, and in particular, to a semiconductor device in which adjacent elements thereof are isolated from each other and a method of making the device.

2. Description of the Related Art

Heretofore, there has been known a semiconductor device in which adjacent elements thereof are isolated from each other by an element isolation region. As such an isolation region, there has been used a transistor (gate) region provided between the adjacent elements as described in U.S. Pat. No. 4,570,331 issued to S. S. Eaton Jr. et al. and in "Fully Planarized 0.5 μm Technologies for 16M DRAM" by W. Wakamiya et al. in IEDM Tech. Dig. (1988), p.p. 246–249. To manufacture an element isolation transistor (gate) of this kind, ions of boron $B^+$ 102 are first implanted into the overall surface of a p-type silicon substrate 101 to form an impurity diffusion region 103 as shown in FIG. 2A. Next, there are sequentially fabricated a first silicon dioxide layer 104, a polycrystalline silicon layer 105, and a second silicon dioxide layer 106 as shown in FIG. 2B. Subsequently, the layers 104 to 106 are patterned by etching process to form an element isolating three-layer structure 112 including an element isolation gate layer 107, an element isolation gate electrode 108, and an element isolation gate silicon dioxide layer 109, as shown in FIG. 2C. In addition, on a side wall of the three-layer structure 112, there is formed a side wall oxide layer 110 for element isolation. Thereafter, on the element isolation gate electrode 108, there is made a contact terminal (not shown), through which a potential can be applied to the gate electrode. Thus, the process of manufacturing the element isolation region is completed. After the element isolation region is thus formed to provide an isolated element forming region 111, an element such as a transistor is formed in the region 111.

The impurity diffusion region 103 is disposed to increase the threshold voltage of a parasitic transistor, which is formed of a wiring layer (not shown) formed on the element isolation gate region 112 serving as a gate region and surface regions of the substrate on both sides of the three-layer structure 112 respectively functioning as a source region and a drain region, so that a high performance of element isolating ability of the isolation region can be obtained. Boron ions $B^+$ 102 are injected in the region 103 at a dose of about $1 \times 10^{12}$ atoms/cm$^2$ with an injection energy of 10–50 KeV.

However, boron ions ($B^+$) are injected in the overall surface of the silicon substrate 101 for a higher isolation performance of the isolation regions. Moreover, in a subsequent process, boron ions ($B^+$) are implanted into the element forming region 111 to fabricate therein an element such as a transistor. Consequently, in the resultant semiconductor device there is a low stability of elements formed in the regions 111.

In "A 0.5 μm Isolation Technology Using Advanced Poly Silicon Pad LOCOS (APPL)" by T. Nishihara et al, IEDM 1988, pp 100 to 103, it is also proposed to increase the element isolation ability by channel stop implantation and deep channel implantation.

SUMMARY OF THE INVENTION

It is therefore an object of the present invention to provide a semiconductor device and a method of fabricating the device capable of improving the element isolating performance of the element isolation region and increasing the stability of the element manufactured in the isolated element forming region, thereby solving the above problem.

According to the present invention, there is provided a semiconductor device including a silicon substrate, an element isolating layer stack formed between adjacent element forming regions on the substrate, an impurity diffusion region containing diffused impurity and being formed in a region of the substrate just beneath the element isolating layer stack, and an impurity diffusion layer containing the diffused impurity spaced apart from a surface of the substrate by at least a predetermined distance.

According to the present invention, there is provided a method of making a semiconductor device, including the steps of forming, on a region of a silicon substrate between adjacent element forming regions, a layer stack of a predetermined pattern to isolate the adjacent elements from each other, and injecting impurity ions from a position above a surface of the silicon substrate with a selected ion injection energy and a selected injection dose of ions to thereby form a diffusion layer containing the impurity in a region of the substrate just beneath the element isolating layer stack.

According to the present invention, in a region of the substrate of the semiconductor device just below an element isolation layer stack located between adjacent element forming regions, there is manufactured an impurity diffusing region. In consequence, the element isolating efficiency is increased. In a region of the substrate associated with the element forming region, an impurity diffusion region is formed spaced apart from the surface thereof by a predetermined distance, thereby maintaining a high stability of the element formed therein.

BRIEF DESCRIPTION OF THE DRAWINGS

These and other objects and advantages of the present invention will become apparent by reference to the following description and accompanying drawings wherein.

DESCRIPTION OF THE PREFERRED EMBODIMENTS

Referring to FIGS. 1A to 1E, description will be given of an embodiment according to the present invention.

Figure 1A:
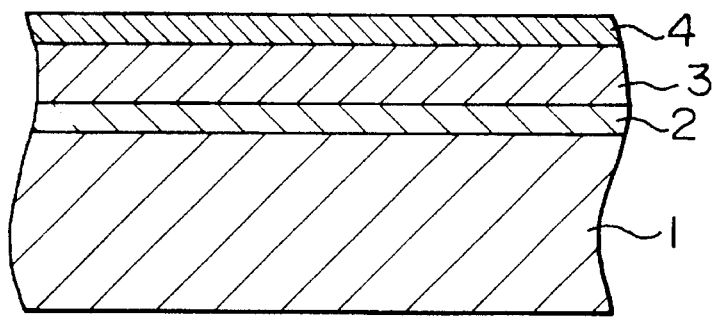
FIGS. 1A to 1E are cross-sectional views schematically showing structures of a semiconductor device in the respective steps in an embodiment of the method according to the present invention.

First, as shown in FIG. 1A, on a p-type silicon substrate 1, there is formed a first silicon dioxide layer 2 through a thermal oxidation. Next, a polycrystalline silicon layer 3 is fabricated on the overall surface of the layer 2 in a chemical vapor deposition (CVD) process. Thereafter, on the overall surface of the layer 2, there is formed a second silicon dioxide layer 4 according to a CVD process. In this case, the layers 2 to 4 have thicknesses of about 10 to 100 nm, about 50 to 500 nm, and about 100 to 300 nm, respectively.

Figure 1B:
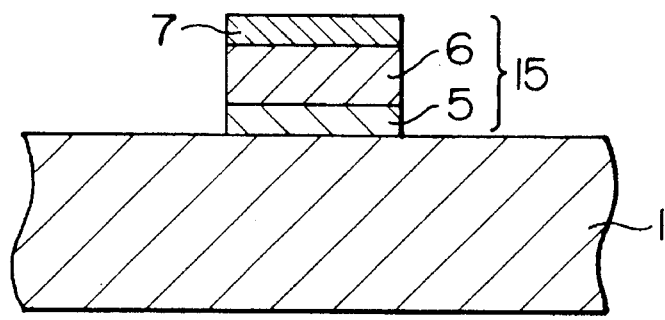

Next, as shown in FIG. 1B, the first silicon dioxide film 2, polycrystalline silicon layer 3 and second silicon dioxide layer 4 are patterned by a lithography and etching process into a desired pattern to provide a lamination or stack 15 for element isolation including an element isolation gate lower oxide film 5, element isolation gate electrode 6 and element isolation gate upper oxide film 7.

Figure 1C:
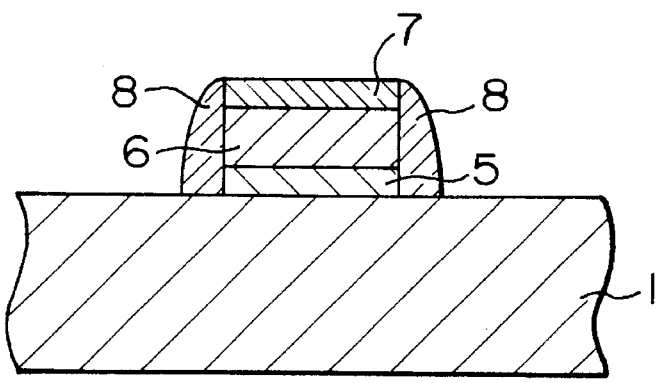

Thereafter, on the overall surface of the silicon substrate 1, there is accumulated a silicon dioxide layer having a thickness of about 10 to 500 nm through a CVD process. Then, an etching process is applied to the overall surface, thereby to form, as shown in FIG. 1C, a sidewall oxide layer 8 for element isolation on the side wall of the stack 15 including the silicon dioxide layer 5, the electrode region 6, and the silicon dioxide layer 7.

Figure 1D:
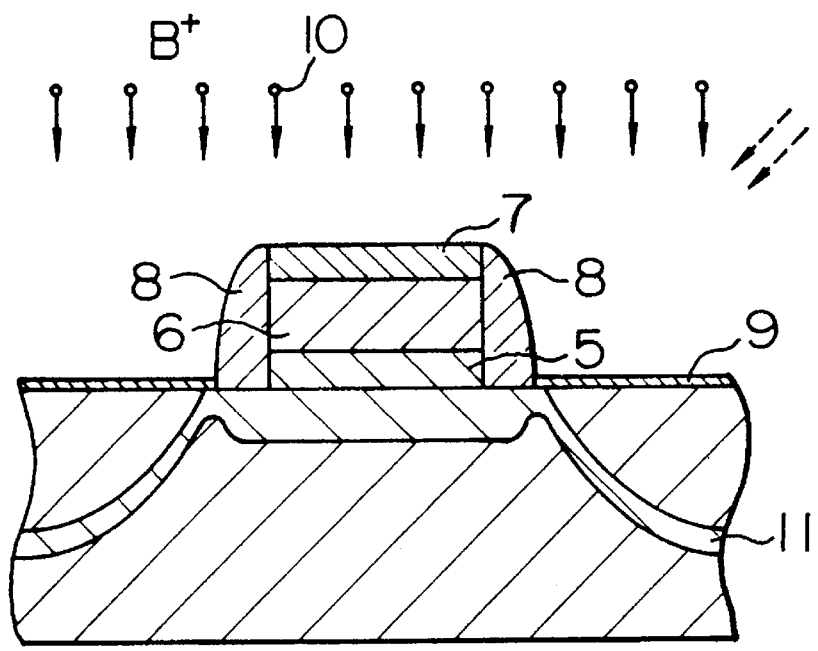
Figure 1E:
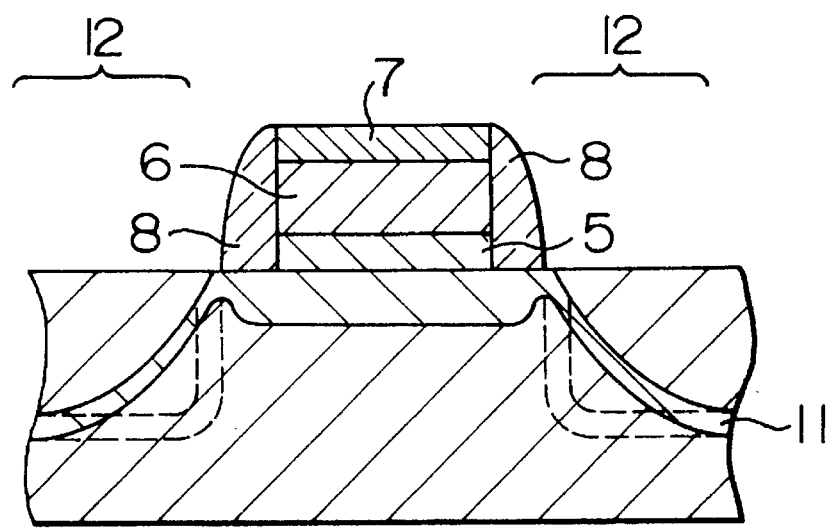
Figure 2A:
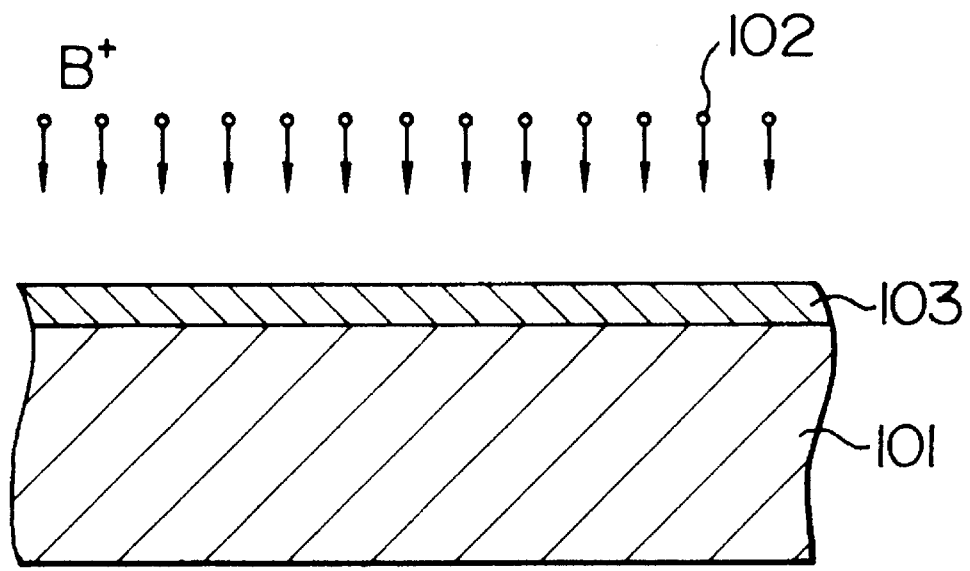
FIGS. 2A to 2D are diagrams respectively showing cross sections of a semiconductor device in the respective steps of a method of fabricating the device in the prior art.
Figure 2B:
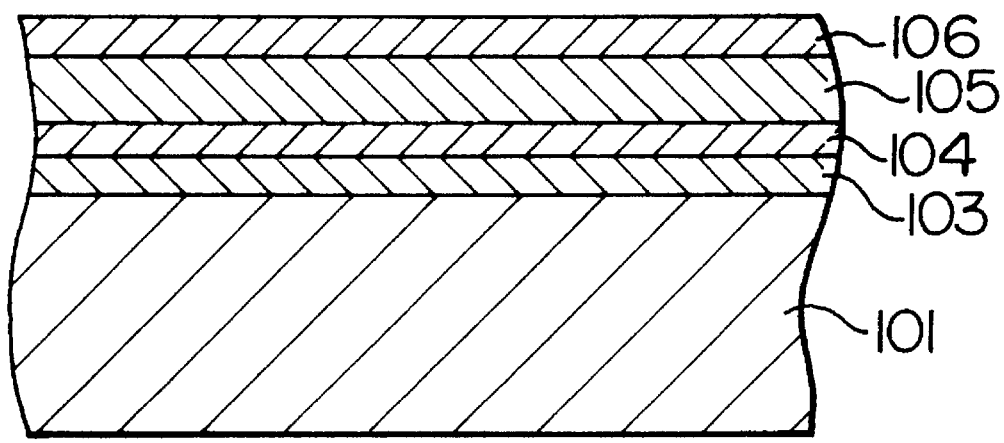
Figure 2C:
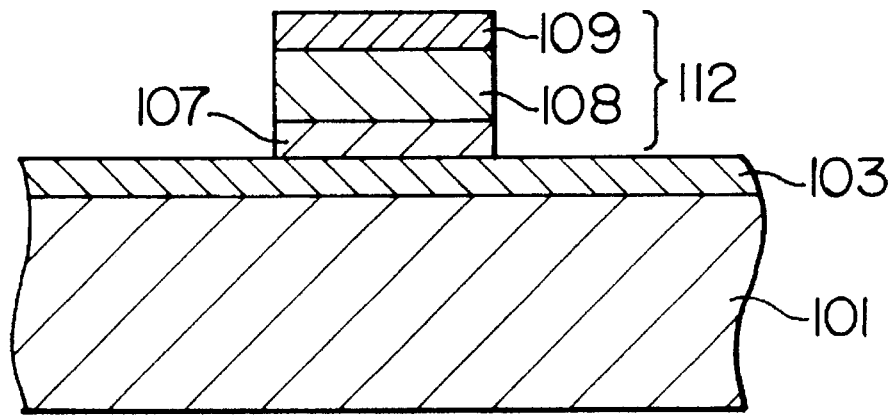
Figure 2D:
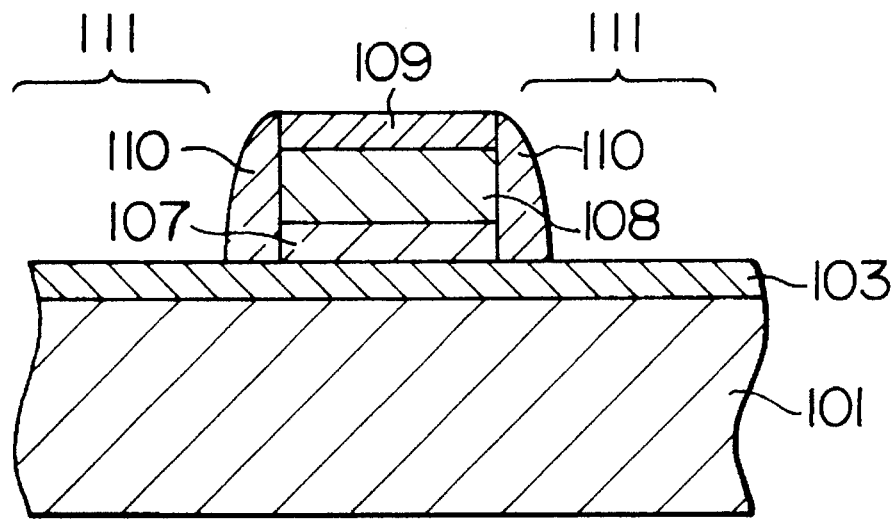

Furthermore, as can be seen from FIG. 1D, there is formed a third silicon dioxide layer 9 by a thermal oxidation or CVD, with a thickness of about 10 to 100 nm. Thereafter, boron ions ($B^+$) 10 are implanted in the entire surface of the silicon substrate 1 with an incident angle of 90°, namely along a line substantially vertical to the surface of the substrate 1. Consequently, just beneath the silicon dioxide layer 5 and the side wall oxide layer 8, there is formed an impurity diffusion region 11 to increase the element isolation efficiency. In addition to boron ions, there may be employed ions of $BF^+$, $P^+$, $As^+$, or the like. The dose thereof in the ion implantation step ranges from about $1 \times 10^{11}$ to $1 \times 10^{13}$ atoms/cm$^2$ and the ion injection or implantation energy is favorably set to about 50 to 500 KeV. Controlling the injection energy, it is possible to inject ions through the element isolation stack 15 so as to form an impurity diffusion region 11 just therebelow. The region 11 has a thickness of about 0.1 to 0.3 micrometer. On the other hand, in an active region enclosed by the element isolation region, where no element isolating stack 15 including the layers 5 to 7 exists, the impurity diffusion region 11 is formed at a depth of the substrate 1 spaced apart from the silicon substrate surface by about 160 to 900 nm with a thickness of about 0.6 to 2 micrometers. The diffusion region 11 does not extend in the active region when an element such as a transistor is to be formed later.

Subsequently, the third silicon dioxide layer 9 is removed through a wet etching process using HF or the like to form an element forming region 12 for element fabrication. In addition, although not shown, a contact terminal is formed to the element isolation gate electrode region 6 in the succeeding process so that a potential can be applied thereto. Thus, the manufacturing of the element isolation region is finished.

In the above embodiment, the ion injection is carried out along a line perpendicular to the silicon substrate surface for the impurity implantation. However, as indicated by arrows of dotted lines in FIG. 1D, when the ion injection is conducted at an angle ranging from 90° to 45° with respect to the substrate surface, it is possible to cause the impurity diffusion region 11 to extend substantially vertically at an end portion of the element forming region 12 as shown by dotted lines in FIG. 1E. This remarkably suppresses inferences between the element formed in the region 12 and the region 11.

Additionally, according to the embodiment, a p-type or an n-type silicon substrate may be employed. Furthermore, although the polycrystalline silicon layer 3 and the second silicon dioxide layer 4 are formed by a CVD process, it will be appreciated that any appropriate process such as a sputtering process may be used.

As above, in the method of making a semi-conductor device according to the present invention, the impurity diffusion region provided to improve element isolation efficiency is formed at a depth of the silicon substrate in the element forming region. This is effective to improve an efficiency in isolation of the element such as transistor fabricated thereafter in the element forming region without exerting any adverse influence upon the element, thereby increasing stability of the elements as formed.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention.

What is claimed is:

1. A method of making a semiconductor device comprising the steps of:

forming an element isolation layer stack on a first region of a silicon substrate between adjacent element forming regions; and injecting impurity ions upon an entire surface of the silicon substrate so as to form a diffusion layer and whereby said diffusion layer is formed at a first portion disposed in a surface of the substrate just beneath the element isolation layer stack and also at a second portion disposed in the surface of the substrate inside each of the element forming regions adjacent to said first region at a depth spaced from the surface of the substrate at the element forming region which is deeper than that of the first portion.

2. A method according to claim 1, wherein the element isolating layer stack includes a three-layer structure including a first silicon dioxide layer, a polycrystalline silicon layer, and a second silicon dioxide layer successively laminated on the substrate.

3. A method according to claim 1, further comprising the step, between the step of forming the element isolation layer stack and the step of injecting ions, of forming sidewalls on both sides of the element isolation layer stack, the impurity diffusion layer being formed in the substrate just beneath the element isolation layer stack and the sidewalls.

4. A method according to claim 1, wherein the impurity ions are injected into the substrate with an angle ranging from 90° to 45° with respect to the substrate surface.

5. A method according to claim 1, wherein said second portion is disposed at a depth of 160 to 900 nm from the surface of the substrate at each of the element forming regions.

6. A method of making a semiconductor device comprising the steps of:

forming an element isolation layer stack on a first region of a silicon substrate between adjacent element forming regions; and injecting impurity ions upon a surface of the silicon substrate including said first region and said element forming regions to form a diffusion layer having a first portion disposed in a surface of the substrate of said first region just beneath the element isolation layer stack and a second portion disposed in the substrate underneath each of the element forming regions at a depth spaced from the surface of the substrate which is deeper than that of the first portion.

* * * * *